United States Patent
Inoue et al.

(10) Patent No.: US 11,822,125 B2
(45) Date of Patent: Nov. 21, 2023

(54) MULTIPLEXING OPTICAL SYSTEM

(71) Applicants: Mitsubishi Electric Corporation, Tokyo (JP); Kyoto University, Kyoto (JP)

(72) Inventors: Yoko Inoue, Tokyo (JP); Masato Kawasaki, Tokyo (JP); Tatsuya Yamamoto, Tokyo (JP); Kazuki Kuba, Tokyo (JP); Susumu Noda, Kyoto (JP)

(73) Assignees: MITSUBISHI ELECTRIC CORPORATION, Tokyo (JP); KYOTO UNIVERSITY, Kyoto (JP)

( * ) Notice: Subject to any disclaimer, the term of this patent is extended or adjusted under 35 U.S.C. 154(b) by 400 days.

(21) Appl. No.: 17/273,319

(22) PCT Filed: Sep. 13, 2019

(86) PCT No.: PCT/JP2019/036144
§ 371 (c)(1),
(2) Date: Mar. 4, 2021

(87) PCT Pub. No.: WO2020/059664
PCT Pub. Date: Mar. 26, 2020

(65) Prior Publication Data
US 2021/0318493 A1 Oct. 14, 2021

(30) Foreign Application Priority Data
Sep. 18, 2018 (JP) ................................. 2018-173754

(51) Int. Cl.
*G02B 6/26* (2006.01)
*G02B 6/32* (2006.01)
(Continued)

(52) U.S. Cl.
CPC ............... *G02B 6/262* (2013.01); *G02B 6/32* (2013.01); *G02B 6/43* (2013.01); *H01S 5/0239* (2021.01); *H01S 5/4012* (2013.01)

(58) Field of Classification Search
CPC ............ G02B 6/262; G02B 6/32; G02B 6/43; G02B 6/42; G02B 6/425; G02B 6/4206;
(Continued)

(56) References Cited

U.S. PATENT DOCUMENTS

| 5,333,077 A | 7/1994 | Legar et al. |
| 2002/0090172 A1 | 7/2002 | Okazaki et al. |

(Continued)

FOREIGN PATENT DOCUMENTS

| CN | 103219648 A | 7/2013 |
| JP | 2002-202442 A | 7/2002 |

(Continued)

OTHER PUBLICATIONS

International Search Report and Written Opinion dated Nov. 19, 2019, received for PCT Application PCT/JP2019/036144, Filed on Sep. 13, 2019, 9 pages including English Translation.

(Continued)

*Primary Examiner* — Michael P Mooney
(74) *Attorney, Agent, or Firm* — XSENSUS LLP

(57) ABSTRACT

A multiplexing optical system includes a light source, a lens and a lens array. The light source includes a plurality of light emitting elements of surface emitting lasers. The lens is configured to change and condense optical paths of laser light beams emitted from the light emitting elements. The lens array includes a plurality of lens regions arrayed so as to correspond to respective optical paths of the laser light beams changed by the lens, and is configured to condense the laser light beams by the lens regions to form a multiplexed beam.

19 Claims, 11 Drawing Sheets

(51) Int. Cl.
*G02B 6/43* (2006.01)
*H01S 5/40* (2006.01)
*H01S 5/0239* (2021.01)

(58) Field of Classification Search
CPC ............... G02B 6/4296; H01S 5/0239; H01S 5/4012; H01S 5/02251; H01S 5/005; H01S 5/11; H01S 5/18; H01S 5/185; H01S 5/42; H01S 5/105
See application file for complete search history.

(56) References Cited

U.S. PATENT DOCUMENTS

| | | | |
|---|---|---|---|
| 2005/0073750 | A1 | 4/2005 | Takahashi et al. |
| 2007/0013557 | A1* | 1/2007 | Wang ............... H05B 45/30 340/945 |
| 2008/0013183 | A1 | 1/2008 | Takeuchi et al. |
| 2008/0225257 | A1* | 9/2008 | Kita ............... G02B 27/0927 359/641 |
| 2008/0277570 | A1* | 11/2008 | Saint Clair ....... G01D 5/34776 250/231.18 |
| 2012/0236212 | A1 | 9/2012 | Itoh et al. |
| 2013/0209032 | A1 | 8/2013 | Wallmeroth et al. |
| 2018/0348451 | A1 | 12/2018 | Yamamoto et al. |

FOREIGN PATENT DOCUMENTS

| | | | | |
|---|---|---|---|---|
| JP | 2005-114977 | A | 4/2005 | |
| JP | 2007-248581 | A | 9/2007 | |
| JP | 2008-40447 | A | 2/2008 | |
| JP | 2013-65002 | A | 4/2013 | |
| JP | WO 2016080252 | * | 11/2015 | ............... G02B 6/42 |
| JP | 2017-26660 | A | 2/2017 | |
| WO | 2012/053167 | A1 | 4/2012 | |
| WO | 2013/031836 | A1 | 3/2013 | |
| WO | 2016/129323 | A1 | 8/2016 | |
| WO | 2016/189983 | A1 | 12/2016 | |

OTHER PUBLICATIONS

Japanese Office Action dated Nov. 24, 2021 in Japanese Application No. 202204010.

* cited by examiner

MULTIPLEXING OPTICAL SYSTEM

CROSS-REFERENCE TO RELATED APPLICATIONS

The present application is based on PCT filing PCT/JP2019/036144, filed Sep. 13, 2019, which claims priority to JP 2018-173754, filed Sep. 18, 2018, the entire contents of each are incorporated herein by reference.

TECHNICAL FIELD

The present invention relates to a multiplexing optical system.

BACKGROUND ART

For the purpose of obtaining high laser output, there has been proposed a multiplexing optical system. The multiplexing optical system is configured to condense a plurality of laser light beams emitted from a light source so as to form a multiplexed beam and thereby couple the multiplexed beam to an optical fiber or other transmission means (see, for example, Patent Literature 1).

Patent Literature 1 describes a power combination optical system configured to couple laser light beams emitted from MXN light sources to a single light receiving device by use of coupling means. The coupling means of the power combination optical system includes a collimator optical element, an anamorphic optical element and a light condensing optical element. The anamorphic optical element is arranged such that the magnification in the direction of the array of M elements is larger than the magnification in the direction of the array of N elements.

CITATION LIST

Patent Literature

[PTL 1] JP 2005-114977 A

SUMMARY OF INVENTION

Technical Problem

However, in the power combination optical system of Patent Literature 1, the anamorphic optical element reduces the beam diameters of the laser light beams. Therefore, for each laser light beam, both the beam diameter and the beam interval are reduced at the same ratio.

In the power combination optical system of Patent Literature 1, the beam interval is not relatively reduced. That is, the ratio between the beam diameter and the beam interval is not changed. Therefore, in the multiplexed beam, a beam occupancy in the total beam diameter is not changed. As a result, it is difficult to decrease a light condensing angle and also to increase a light condensing property.

The present invention has been made to solve the above-mentioned problems, and has an object to provide a multiplexing optical system capable of forming a multiplexed beam with a high light condensing property.

Solution to Problem

In order to solve the above-mentioned problems, according to one embodiment of the present invention, there is provided a multiplexing optical system comprising: a light source including a plurality of light emitting elements of surface emitting lasers; an optical path changing member configured to change and condense optical paths of laser light beams emitted from the light emitting elements; and a light condensing member which includes a plurality of lens regions arrayed so as to correspond to respective optical paths of the laser light beams changed by the optical path changing member, and is configured to condense the laser light beams by the lens regions to form a multiplexed beam.

Advantageous Effects of Invention

According to the multiplexing optical system of the present invention, it is possible to form the multiplexed beam with the high light condensing property.

DESCRIPTION OF EMBODIMENTS

Now, details of embodiments of a multiplexing optical system disclosed in the present application are described with reference to the accompanying drawings. It should be noted, however, that the embodiments described below are merely examples, and the present invention is not limited to those embodiments.

Further, in the following embodiments, description is particularly given of a multiplexing optical system configured to condense a plurality of laser light beams emitted from a light source to form a multiplexed beam.

<Light Condensing Property of Multiplexing Optical System>

In a multiplexing optical system, laser light beams emitted from light emitting elements included in a light source are multiplexed to form a high-output multiplexed beam. In this case, as described above, it is important that the multiplexed beam have a high light condensing property.

A beam parameter product (BPP) is an index for evaluating a light condensing property of a beam. The BPP is defined as a product of a beam radius and a light condensing angle or a product of a beam radius and a divergence angle. As is apparent from this definition, when the beam radius is constant, it is effective to decrease the light condensing angle in order to increase the light condensing property.

The same holds true also in a case when a plurality of laser light beams are multiplexed. When a plurality of laser light beams are spatially condensed, in order to form a multiplexed beam with a high light condensing property, the laser light beams are condensed so that the intervals between the adjacent laser light beams are narrowed. In this manner, in the multiplexed beam, a beam occupancy in a beam diameter can be increased.

In particular, when the intervals between adjacent laser light beams are zero, the multiplexed beam can have the highest beam occupancy in the beam diameter. That is, the outermost diameters of adjacent laser light beams are in contact with each other.

In other words, when the beam occupancy in the beam diameter is increased in the multiplexed beam, the light condensing angle of the multiplexed beam can be decreased. Thus, a multiplexed beam with a high light condensing property can be obtained.

First Embodiment

<Configuration of Multiplexing Optical System 100>

Figure 1:
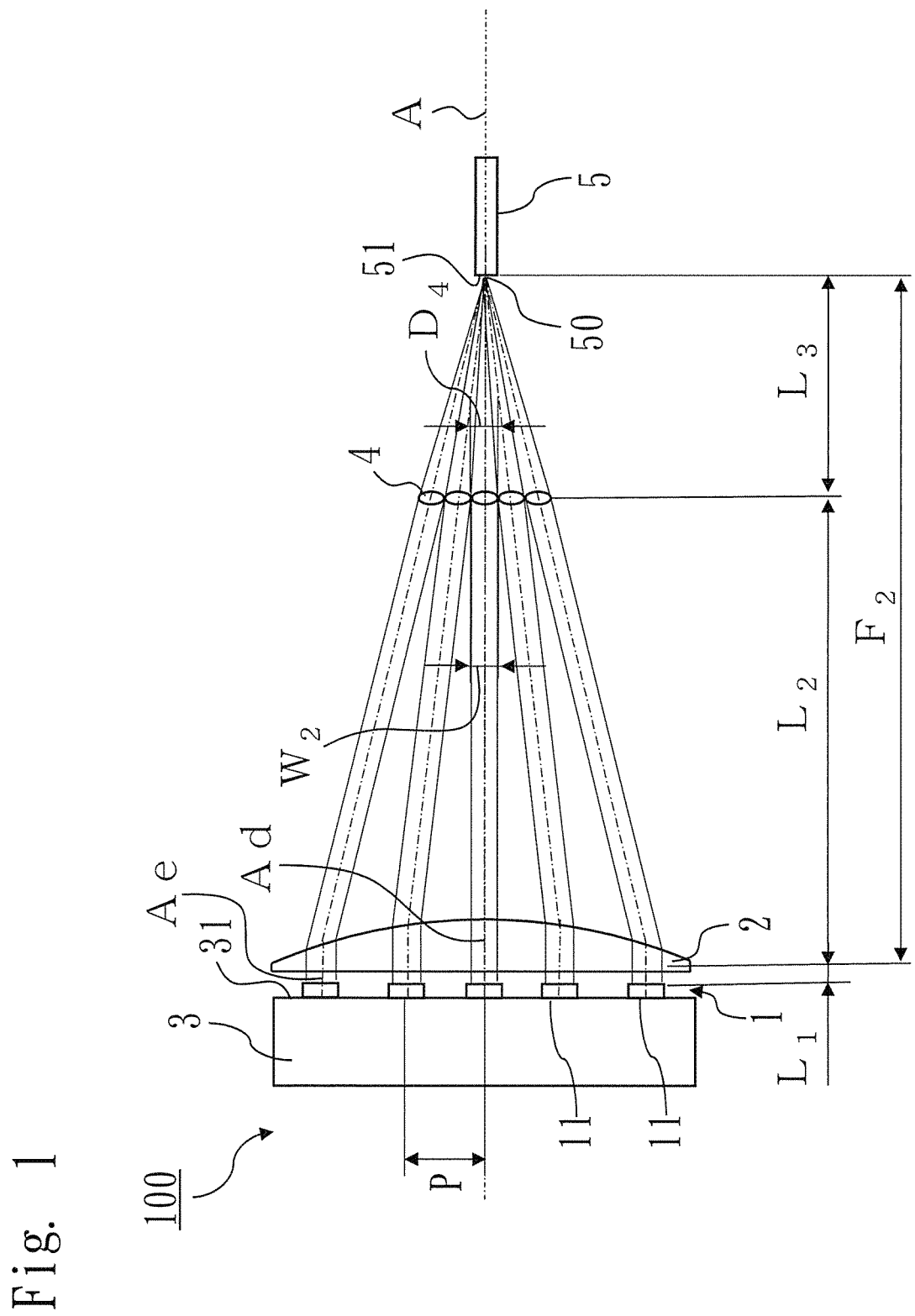
FIG. 1 illustrates a configuration of a multiplexing optical system according to a first embodiment.

FIG. 1 illustrates a configuration of a multiplexing optical system 100 according to a first embodiment of the present invention. FIG. 1 illustrates a cross section including an optical axis A of the multiplexing optical system 100. Now, with reference to FIG. 1, the overall configuration of the multiplexing optical system 100 is described.

The multiplexing optical system 100 includes a light source 1, a lens 2 and a lens array 4. The multiplexing optical system 100 may include an optical fiber 5. The light source 1 includes a plurality of light emitting elements 11. The lens 2 is an example of an optical path changing member. The lens array 4 is an example of a light condensing member. The optical fiber 5 is an example of transmission means.

The light source 1 includes the light emitting elements 11 which are two-dimensional photonic crystal surface emitting lasers. In the first embodiment, the light emitting elements 11 are arrayed on a surface 31 of a heat sink 3. In this case, the surface 31 is a single surface. Further, the light emitting elements 11 are arrayed so that they are directed to the directions parallel to the optical axis A. The heat sink 3 radiates the heat generated by the light emitting elements 11. In this manner, the heat sink 3 acts to suppress temperature rise of the light emitting elements 11.

Figure 2:
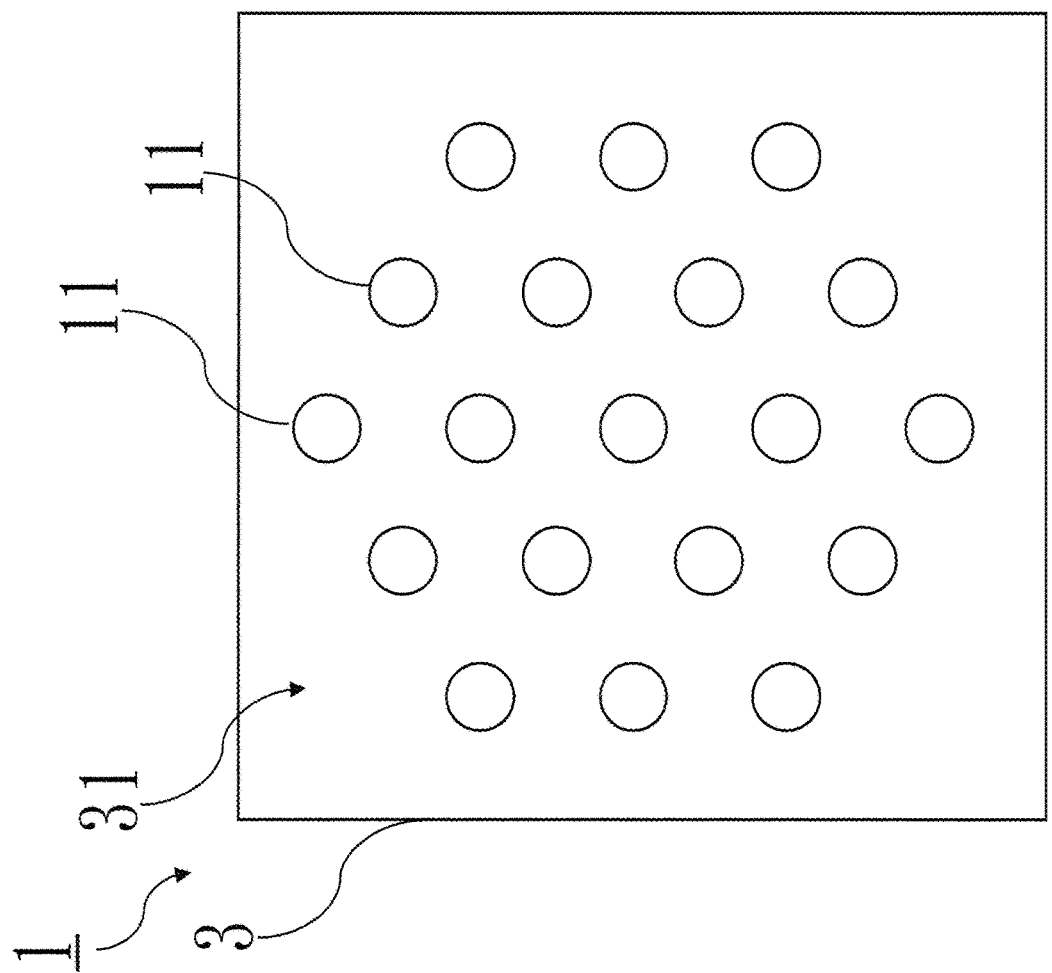
FIG. 2 illustrates a light source in the first embodiment as viewed from a direction of an optical axis A of the multiplexing optical system.

FIG. 2 illustrates the light source 1 including the light emitting elements 11 as viewed from the direction of the optical axis A of FIG. 1. In the first embodiment, the light source 1 includes 19 light emitting elements 11. Further, the light emitting elements 11 are arrayed into a hexagonal lattice shape at intervals. However, the number of light emitting elements 11 and an arrangement mode thereof are not limited to those described above.

Referring back to FIG. 1, an optical axis Ae of each light emitting element 11 is perpendicular to the surface 31. Therefore, the light emitting elements 11 emit laser light beams in a direction perpendicular to the surface 31. The optical axes Ae of the light emitting elements 11 are parallel to each other. Further, the optical axes Ae of the light emitting elements 11 are parallel to the optical axis A of the multiplexing optical system 100.

The laser light beams emitted from the light source 1 enter the lens 2. The lens 2 has a light condensing function. The lens 2 is arranged so that it is perpendicular to the optical axis A of the multiplexing optical system 100. That is, an optical axis Ad of the lens 2 is parallel to the optical axis A of the multiplexing optical system 100.

The lens 2 changes the traveling directions of the laser light beams emitted from the light source 1. That is, the lens 2 changes the optical paths of the laser light beams emitted from the light source 1. Specifically, the lens 2 changes the traveling directions of the laser light beams emitted from the light source 1 toward a center 50 of an incident surface 51 of the optical fiber 5. In this manner, if the lens array 4 to be described later is absent, the optical paths of the laser light beams after passing through the lens 2 are concentrated at the center 50 of the incident surface 51 of the optical fiber 5.

The laser light beams whose optical paths have been changed by the lens 2 enter the lens array 4. The lens array 4 is arranged so that it is perpendicular to the optical axis A of the multiplexing optical system 100. The lens array 4 includes a plurality of lens regions 40 arrayed within the same plane.

The plurality of light emitting elements 11 of the light source 1 and the plurality of lens regions 40 of the lens array 4 have a one-to-one correspondence. The lens regions 40 of the lens array 4 are arrayed at positions corresponding to the respective optical paths of the laser light beams whose optical paths have been changed by the lens 2.

Figure 3:
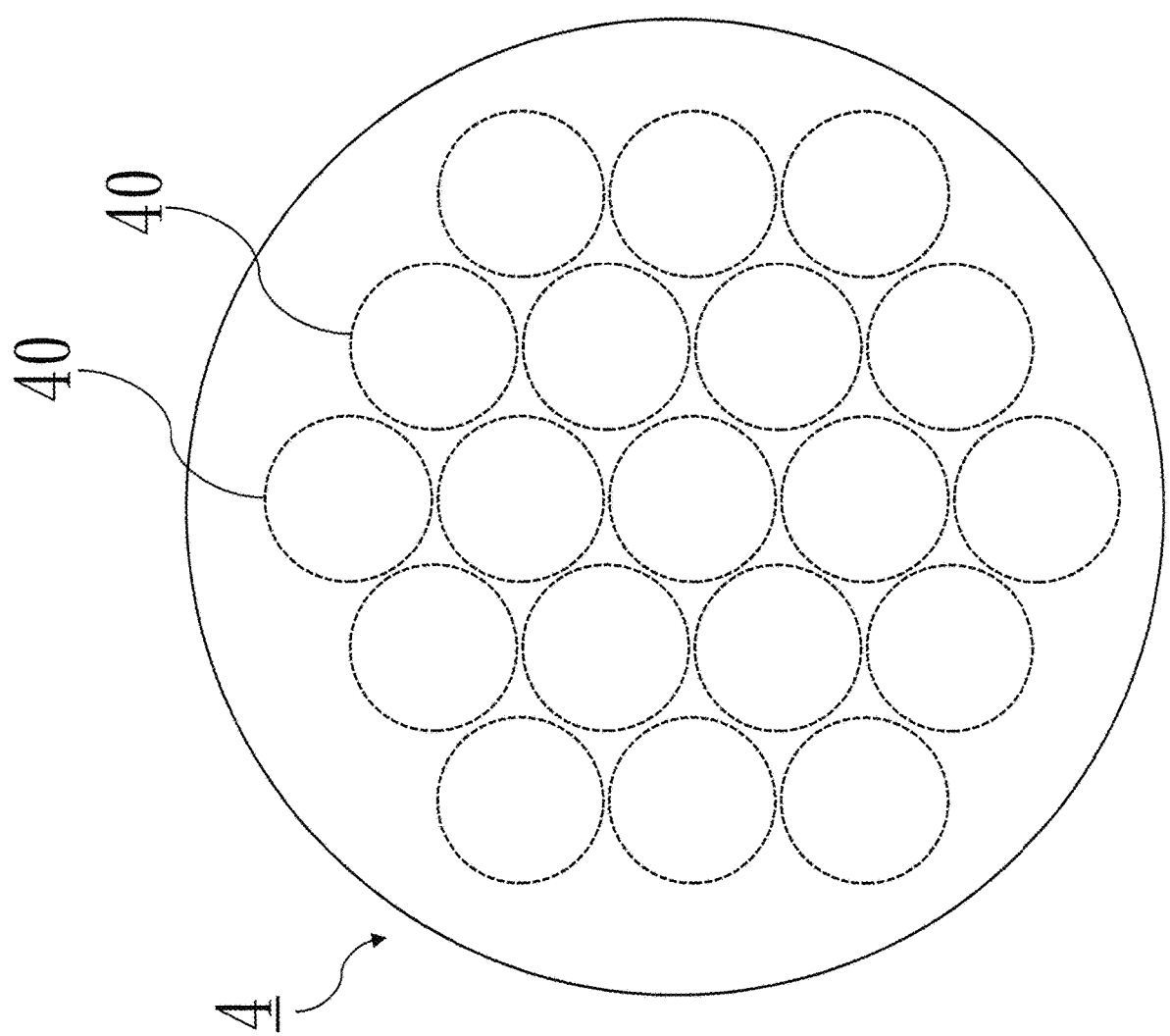
FIG. 3 illustrates a lens array in the first embodiment as viewed from the direction of the optical axis A of the multiplexing optical system.

FIG. 3 illustrates the lens array 4 as viewed from the direction of the optical axis A of FIG. 1. In the first embodiment, the light source 1 includes 19 light emitting elements 11. Therefore, the lens array 4 also includes 19 lens regions 40. Each lens region 40 has a light condensing function. Further, the lens regions 40 are arrayed so that they are adjacent to each other on the same plane. An effective region of the lens array 4 is smaller than a light emitting region of the light source 1.

Referring back to FIG. 1, the laser light beams that have entered the respective lens regions 40 of the lens array 4 pass through the lens array 4, and thereby they are condensed on the incident surface 51 of the optical fiber 5 to become a multiplexed beam.

The optical fiber 5 is an optical fiber for transmission. The optical fiber 5 transmits the multiplexed beam. That is, the optical fiber 5 couples and transmits the condensed laser light beam. Further, in the first embodiment, the optical fiber 5 is a multi-mode fiber. In the multi-mode fiber, light is divided into a plurality of modes to propagate in the core.

The multi-mode fiber has a step index type and a graded index type. The step index type corresponds to an optical fiber having a uniform core refractive index. The graded index type corresponds to an optical fiber having a smoothly-distributed core refractive index. The specification of the optical fiber 5 can be selected as appropriate in consideration of the characteristics and the number of light emitting elements 11.

<Two-Dimensional Photonic Crystal Surface Emitting Laser>

Next, the two-dimensional photonic crystal surface emitting lasers used in the first embodiment are described. The two-dimensional photonic crystal surface emitting laser is a surface emitting-type semiconductor laser in which a periodic structure of around an oscillation wavelength is provided in the vicinity of the active layer. This periodic structure is referred to as "photonic crystal structure."

In general, a semiconductor laser can achieve higher output by increasing its light emitting region. However, a vertical cavity surface emitting laser which is in practical use now has a problem in that the light condensing property is decreased when the light emitting region is increased. Therefore, the vertical cavity surface emitting laser cannot achieve both of high output and a high light condensing property at the same time.

In contrast, the two-dimensional photonic crystal surface emitting laser is capable of, in principle, maintaining the light condensing property even when the light emitting region is increased. Therefore, the two-dimensional photonic crystal surface emitting laser is expected as a laser light source with high output and a high light condensing property.

As typical characteristics of the two-dimensional photonic crystal surface emitting laser, the size of the light emitting region is several hundreds of μm in diameter. Further, the beam quality is from about 1 to about 5 in $M^2$ value. For example, when the oscillation wavelength is 940 nm, the size of the light emitting region is 300 μm in diameter and the beam quality is 2 in $M^2$ value, the divergence angle of the emitted beam is about 0.5 degree in full angle. The two-dimensional photonic crystal surface emitting laser has a large light emitting region and a good beam quality, and hence an emission beam with a high straight traveling property can be obtained. The phrase "good beam quality" means that the $M^2$ value is small.

Further, in the two-dimensional photonic crystal surface emitting laser, for example, when the size of the light emitting region is increased up to 1 mm in diameter, it is expected that 10-W class output can be obtained. Therefore, the two-dimensional photonic crystal surface emitting laser may be a laser light source with high output and a high light condensing property.

<Array Interval of Light Emitting Elements>

In order to operate the semiconductor laser satisfactorily at high output, it is important to take measures against heat generation. In the semiconductor laser, 40% to 60% of supplied power becomes heat. Further, as the output is increased, the generated heat is further increased. Therefore, the light emitting elements of the high-output semiconductor laser are preferred to be mounted on a cooling structure including a sub-mount or a heat sink.

In the cooling structure, the heat generated by the light emitting elements is transmitted, dispersed and radiated. As the generated heat is increased, the cooling structure is increased in size. When the two-dimensional photonic crystal surface emitting laser is used to obtain 10-W output, it is calculated that the array interval of the light emitting elements 11 is required to be about several mm for heat radiation.

Further, the two-dimensional photonic crystal surface emitting laser is structured so that an electrode structure for supplying power is provided around a light emitting surface. When the electrode is made of a metal that does not transmit light, adjacent light emitting elements 11 are required to be arrayed so as not to block the laser light beam at this part.

For the above-mentioned reason, when the light emitting elements 11 of the two-dimensional photonic surface emitting lasers are arrayed so that they close to each other, the emitting elements 11 are required to be arrayed while ensuring required distances between the adjacent light emitting elements 11. In other words, the light emitting elements 11 are required to be arrayed at intervals. As described above with reference to FIG. 2, in the first embodiment, the light emitting elements 11 are arrayed at intervals.

<Operation of Multiplexing Optical System 100>

Next, the operation of the multiplexing optical system 100 according to the first embodiment is described. As illustrated in FIG. 2, the multiplexing optical system 100 condenses the plurality of laser light beams emitted from the light emitting elements 11 arrayed at intervals, to thereby form the multiplexed beam. In this case, the light condensing property of the multiplexed beam is increased by increasing the beam occupancy in the diameter of the multiplexed beam.

First, reference symbols used in the multiplexing optical system 100 are described. At this time, refer to also FIG. 1. The focal length of the lens 2 is represented by $F_2$. Further, although not shown in FIG. 1, the focal length of the lens array 4 is represented $F_4$.

The distance from each light emitting element 11 of the light source 1 to the lens 2 is represented by $L_1$. The distance from the lens 2 to the lens array 4 is represented by $L_2$. The distance required to condense the laser light beams that have passed through the lens array 4 is represented by $L_3$.

The diameter of each laser light beam which enters the lens array 4 is represented by $W_2$. The diameter of the laser light beam corresponds to a beam diameter. The size of each lens region 40 of the lens array 4 is represented by $D_4$. For example, $D_4$ is a diameter of each lens region 40. The array interval of the light emitting elements 11 arrayed on the surface 31 of the heat sink 3 is represented by P.

Further, although not shown in FIG. 1, a center light beam of each of the 19 laser light beams emitted from the 19 light emitting elements 11 is represented by $A_n$. The suffix n is n=1, 2, ..., N. N is the number of light emitting elements 11, which is N=19 in the first embodiment. The center light beam refers to a center line passing through the center of the beam diameter in the laser light beam.

In the first embodiment and second to fourth embodiments to be described later, the beam diameter of each laser light beam is defined as a diameter such that the encircled power of the light intensity distribution is 86.5%. Further, the "laser light beam" herein means light having the thus defined beam diameter. In this case, the outermost diameter of the laser light beam refers to a diameter at which the encircled power of the light intensity distribution is 86.5%. The beam diameter of the multiplexed beam is defined in a similar manner.

Next, the operation of the multiplexing optical system 100 is described. The light emitting elements 11 emit the laser light beams in parallel to the optical axis A of the multiplexing optical system 100. The laser light beams enter the lens 2 perpendicularly. That is, the laser light beams emitted from the light emitting elements 11 are parallel to the optical axis Ad of the lens 2. In this case, the light emitting elements 11 are two-dimensional photonic crystal surface emitting lasers.

The traveling directions of the center light beams $A_n$ of the laser light beams that have entered the lens 2 are changed before the laser light beams exit from the lens 2. Specifically, the center light beams $A_n$ of the laser light beams exiting from the lens 2 are condensed toward one point at a position apart from the lens 2 by the distance F2. That is, the center light beams $A_n$ of the laser light beams are condensed at the position apart from the lens 2 by the distance F2.

In the first embodiment, the incident surface 51 of the optical fiber 5 is arranged at the position apart from the lens 2 by the distance F2. Therefore, if the lens array 4 is absent, the center light beams $A_n$ of the laser light beams exiting from the lens 2 are condensed at the center 50 of the incident surface 51 of the optical fiber 5.

Further, in the laser light beams exiting from the lens 2, the adjacent laser light beams approach each other as they travel. Then, at the position apart from the lens 2 by the distance L2, the outermost diameters of the adjacent laser light beams are in contact with each other.

The lens array 4 is arranged at the position apart from the lens 2 by the distance L2. In other words, the lens array 4 is arranged at a position where the outermost diameters of the adjacent laser light beams exiting from the lens 2 are in contact with each other. Then, the laser light beams enter the corresponding lens regions 40 of the lens array 4.

In the lens array 4, the 19 lens regions 40 are integrally molded. When the lens array 4 is manufactured by integral molding, a holding structure is not required between the lens regions 40. Further, an ineffective region having no lens effect can be reduced or eliminated.

In the first embodiment, the size $D_4$ of each lens region 40 of the lens array 4 is determined so as to be equal to the beam diameter $W_2$ of the entering laser light beam. As a result, the adjacent laser light beams that have entered the lens array 4 exit from the lens array 4 so that their outermost diameters are in contact with each other.

Further, each center light beam $A_n$ of the laser light beams passes through the center of the corresponding lens region 40 in the lens array 4. Thus, each center light beam $A_n$ of the laser light beams travels straight inside the lens array 4. The center light beams $A_n$ of the laser light beams that have passed through the lens regions 40 of the lens array 4 are condensed at a focal position of the lens array 4.

Further, each laser light beam enters the corresponding lens region 40 of the lens array 4. Each laser light beam enters only the corresponding lens region 40 of the lens array 4. Therefore, each laser light beam passes through the lens array 4 so that its energy loss is suppressed at the minimum. The laser light beams that have passed through the lens array 4 are condensed at the center 50 of the incident surface 51 of the optical fiber 5 to become the multiplexed beam. Their energy are concentrated at the center 50 of the incident surface 51 of the optical fiber 5.

In the first embodiment, the conditions of the multiplexing optical system 100 are set such that the sum of the distance $L_2$ and $L_3$ is equal to the focal length $F_2$. The conditions of the multiplexing optical system 100 are such as the focal length $F_2$, the focal length $F_4$, the distance $L_1$, the distance $L_2$ and the distance $L_3$.

The conditions of the multiplexing optical system 100 are set depending on the characteristics of the light source and desired characteristics of the multiplexed beam. The "characteristics of the light source 1 and the multiplexed beam" are such as the number of light emitting elements to be multiplexed, the beam quality, the beam diameter and the oscillation wavelength.

After those values are determined, the beam diameters $W_2$ of the laser light beams entering the lens array 4 can be calculated. In this manner, the size $D_2$ of the lens regions 40 in the lens array 4 and the array interval P of the light emitting elements 11 can be determined.

In the multiplexing optical system 100 designed as described above, the laser light beams emitted from the light emitting elements 11 are condensed at one point and thereby they become the multiplexed beam. At the position where the laser light beams are condensed at one point, each laser light beam forms a smallest spot.

In the first embodiment, the 19 light condensing spots of the 19 laser light beams emitted from the 19 light emitting elements 11 overlap each other at one point. That is, the light condensing spots of the laser light beams overlap each other. At this time, the energies of the laser light beams emitted from the 19 light emitting elements 11 are concentrated at one point with small loss.

Further, the laser light beams after passing through the lens array 4 exit so that the outermost diameters of the adjacent laser light beams are in contact with each other. Therefore, the beam occupancy in the beam diameter of the multiplexed beam can be increased. That is, the light condensing property of the multiplexed beam can be increased.

When an actual lens having thickness is used, the center light beams $A_n$ of the laser light beams which obliquely enter the lens are slightly deviated in parallel between the front and rear sides of the lens. Such a case can be addressed by adjusting the array interval P of the light emitting elements 11 on the heat sink 3.

By adjusting the array interval P of the light emitting elements 11, the center light beams $A_n$ of the laser light beams after passing through the lens array 4 can be condensed at an assumed position. In this case, the assumed position is the center 50 on the incident surface 51 of the optical fiber 5. After adjusting the array interval P of the light emitting elements 11, the array interval P is non-uniform throughout all the light emitting elements 11. However, this configuration does not cause a problem.

In the description above, the "beam diameter" is defined as a width such that the encircled power of the light intensity distribution is 86.5%. However, the definition of the beam diameter is not limited thereto. The beam diameter may be defined depending on the required light utilization efficiency or beam quality of the multiplexed beam.

Further, each lens region 40 in the lens array 4 is not required to be formed into a circle shape as illustrated in FIG. 3. For example, each lens region 40 may be formed into a hexagonal shape including a circular lens part. For example, each lens region 40 may be formed into a hexagonal shape in which a circular lens is inscribed. Further, a partial side of the hexagonal shape may have an arc shape.

<Coupling to Optical Fiber>

The optical fiber 5 is arranged so that the center 50 of its incident surface 51 matches the position at which the laser light beams emitted from the light emitting elements 11 are condensed at one point to be formed into the multiplexed beam. The center 50 of the incident surface 51 of the optical fiber 5 matches the position at which the laser light beams emitted from the light emitting elements 11 are condensed to be formed into the multiplexed beam.

In the optical fiber 5, a light condensing spot diameter of the laser light beam and the core diameter of the fiber have an appropriate relationship described below. The light condensing spot diameter of the laser light beam is the beam diameter of the multiplexed beam. Further, in the optical fiber 5, the NA with the light condensing of the multiplexing optical system 100 and the allowable NA of the optical fiber 5 have an appropriate relationship described below. "NA" refers to a numerical aperture.

It is preferred that the core diameter of the optical fiber 5 ensures a coupling efficiency of from 90% to 99.5% with respect to the total power of the multiplexed beam.

When a large core diameter is selected, the beam coupling efficiency at the incident surface 51 of the optical fiber 5 is close to 100%. However, the laser light beam that has entered the optical fiber 5 is reflected at the interface between the core and the cladding while propagating inside the optical fiber 5. Therefore, the laser light beam is dispersed on a cross section perpendicular to the transmission direction. As a result, the light condensing property of the laser light beam is decreased.

Meanwhile, when a small core diameter is selected, the energy loss of the laser light beam propagating inside the optical fiber 5 is increased. Further, the laser light beam that has not entered the core of the optical fiber 5 is radiated to the cladding or therearound. As a result, the laser light beam that has not entered the core of the optical fiber 5 causes heating or burnout in the vicinity of the incident surface 51.

Further, the allowable NA of the optical fiber 5 is preferred to be from 1.2 times to 3 times the NA with condensing of the multiplexed beam. When the allowable NA of the optical fiber 5 is excessively large, coupling to a higher order mode easily occurs depending on the installation state of the optical fiber 5 or the like. Therefore, the light condensing property is deteriorated during transmission of the laser light beam.

When the allowable NA of the optical fiber is equal to or smaller than the NA with condensing of the multiplexed beam, energy loss occurs at the time of coupling or during transmission of the laser light beam. As a result, damage of the optical fiber 5 or damage of surrounding components may be caused from a part from which light leaks out.

In this manner, the laser light beams are efficiently coupled to the optical fiber 5. Then, the laser light beams propagate inside the optical fiber 5 so that reduction in beam quality is suppressed. From an exit surface of the optical fiber 5, a multiplexed beam with high output and a high light condensing property is output.

When the number of light emitting elements 11 is from about 2 to about 20, it is preferred to use a large mode area fiber as the optical fiber 5. A large mode area fiber is one type of multi-mode fiber. The large mode area fiber has a large core diameter of several tens of μm, and a small allowable NA of about 0.15 or less. The large mode area fiber allows transmission only in a low-order mode. While the multiplexed beam is transmitted in the fiber, coupling to a high-order mode is suppressed. As a result, the light condensing property of the output laser light beam can be maintained to be high.

SPECIFIC NUMERICAL EXAMPLES

Next, specific numerical examples in the multiplexing optical system 100 according to the first embodiment are described.

Numerical Example 1

Table 1 shows a first example of the specification of the multiplexing optical system 100. The light emitting elements 11 of the light source 1 are arranged into a hexagonal lattice shape.

TABLE 1

| Symbol | Value |
|---|---|
| $W_0$ | 1 mm |
| $M^2$ | 2 |
| N | 19 |
| P | 1.6 mm |
| $F_4$ | 3.3 mm |
| $F_2$ | 60 mm |
| $L_1$ | 2 mm |
| $L_2$ | 57 mm |
| $L_3$ | 2.7 mm |
| $D_4$ | 0.15 mm |

In Table 1, the beam diameter of each light emitting element 11 of the light source 1 is represented by $W_0$. The beam quality is represented by $M^2$. The number of light emitting elements 11 is represented by N.

In the case of the specification of Table 1, the characteristics of the multiplexing optical system 100 are as follows. The size of the light condensing spot is about 48 μm in diameter. The NA with the light condensing is about 0.13. The characteristics of the optical fiber 5 are as follows as an example. The core diameter of the optical fiber 5 is about 50 μm in diameter. The allowable NA of the optical fiber is NA=0.16.

Numerical Example 2

Table 2 shows a second example of the specification of the multiplexing optical system 100. The light emitting elements 11 of the light source 1 are arranged into a hexagonal lattice shape.

TABLE 2

| Symbol | Value |
|---|---|
| $W_0$ | 0.2 mm |
| $M^2$ | 1.5 |
| N | 19 |
| P | 0.7 mm |
| $F_4$ | 5.5 mm |
| $F_2$ | 35 mm |
| $L_1$ | 2 mm |
| $L_2$ | 28.5 mm |
| $L_3$ | 6.4 mm |
| $D_4$ | 0.26 mm |

In the case of the specification of Table 2, the characteristics of the multiplexing optical system 100 are as follows. The size of the light condensing spot is about 44 μm in diameter. The NA with the light condensing is about 0.1. The characteristics of the optical fiber 5 are as follows as an example. The core diameter of the optical fiber 5 is about 50 μm in diameter. The allowable NA of the optical fiber is NA=0.12.

Effects of First Embodiment

As described above, the multiplexing optical system 100 according to the first embodiment of the present invention includes a light source, an optical path changing member and a light condensing member. The light source includes a plurality of light emitting elements. The light emitting elements are two-dimensional photonic crystal surface emitting lasers. The optical path changing member is configured to change and condense optical paths of laser light beams emitted from the light emitting elements. The optical path changing member is configured to change and condense optical paths of laser light beams emitted from the light emitting elements. The light condensing member is configured to condense the laser light beams exiting from the optical path changing member by a plurality of lens regions to form a multiplexed beam.

With the above-mentioned features, the multiplexing optical system 100 according to the first embodiment of the present invention is a multiplexing optical system with a high light condensing property. Further, the multiplexing optical system 100 is a high-output multiplexing optical system.

Further, the light condensing member is arranged at a position where the outermost diameters of adjacent laser light beams exiting from the optical path changing member are in contact with each other. In this manner, the light condensing property of the multiplexed beam can be further increased.

Further, a size of each of the lens regions included in the light condensing member is determined such that the size is equal to a beam diameter of each of the laser light beams entering the lens regions. Further, the laser light beams exit from the light condensing member so that outermost diameters thereof are in contact with each other. In this manner, the light condensing property of the multiplexed beam is further increased.

Further, a lens is used as the optical path changing member. In this manner, the optical paths of the laser light beams can be changed with simple means at high accuracy.

Further, a lens array is used as the light condensing member. In this manner, the ineffective region between the lens regions can be minimized so that the laser light beams can be brought closer to each other. Therefore, the light condensing property of the multiplexed beam can be increased.

Further, the light emitting elements are arrayed into a hexagonal lattice shape. Further, the light emitting elements are arrayed in a densest manner. Therefore, the laser light beams to be the multiplexed beam enter the optical path changing member so that the laser light beams close to each other as much as possible. In this manner as well, a multiplexed beam having a high light condensing property can be easily obtained. The term "dense" generally represents a crowded and closely packed state.

Further, a large mode area fiber is used as the optical fiber. In this manner, the light condensing property of the laser light beam output from the optical fiber can be maintained to be high.

Second Embodiment

<Array with Square Lattice Shape>

Figure 4:
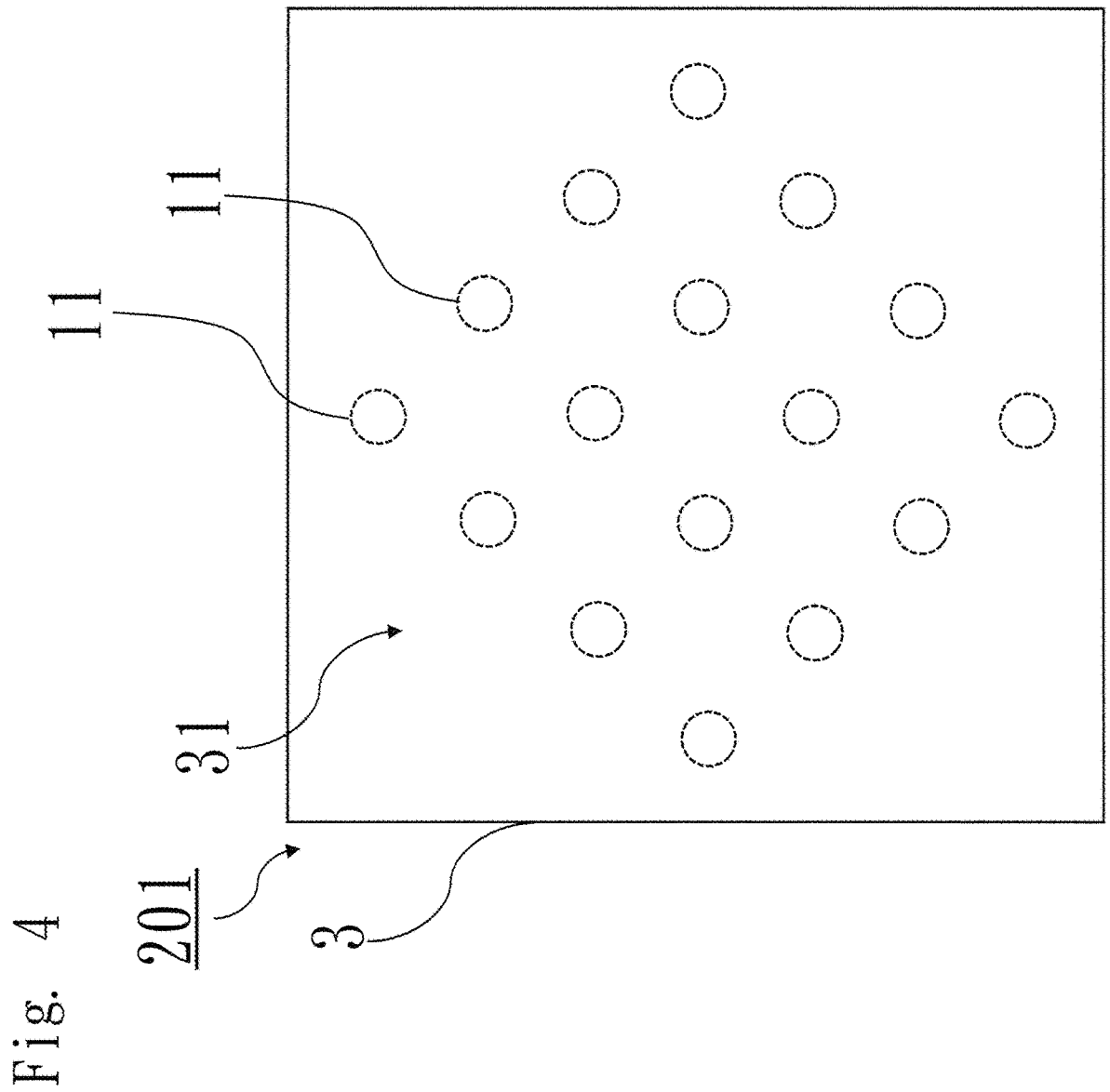
FIG. 4 illustrates a light source in a second embodiment as viewed from the direction of the optical axis A of the multiplexing optical system.
Figure 5:
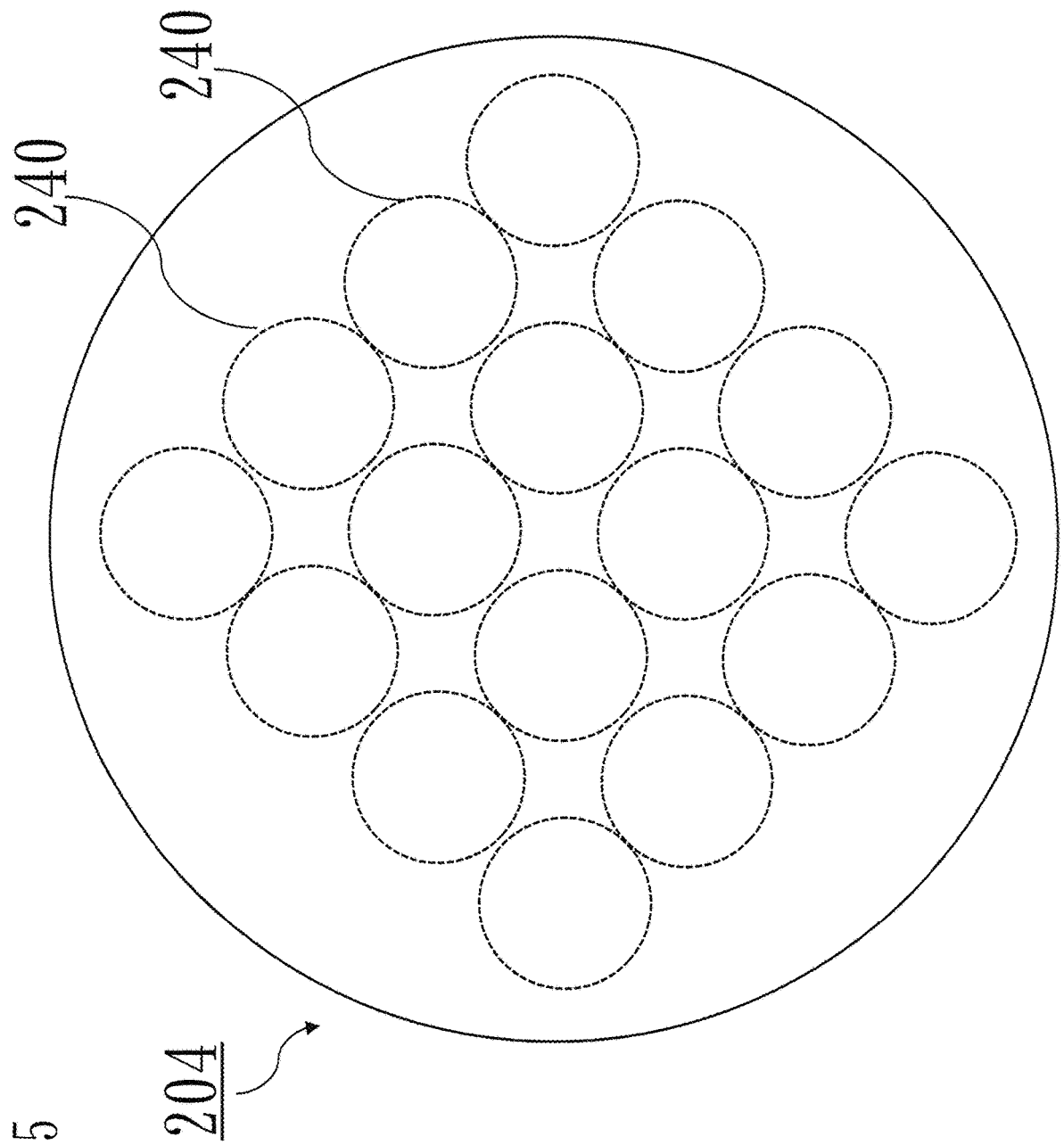
FIG. 5 illustrates a lens array in the second embodiment as viewed from the direction of the optical axis A of the multiplexing optical system.

FIG. 4 illustrates an array of light emitting elements 11 included in a light source 201 in a multiplexing optical system according to a second embodiment of the present invention. Further, FIG. 5 illustrates an array of lens regions 240 in a lens array 204 in the second embodiment.

In the second embodiment, the light source 201 includes 16 light emitting elements 11. The 16 light emitting elements 11 are arrayed into a square lattice shape on the surface 31 of the heat sink 3. For example, the surface 31 is a single surface.

The beam occupancy obtained by the array with the square lattice shape in the second embodiment is lower than the beam occupancy obtained by the array with the hexagonal lattice shape in the first embodiment. However, when FIG. 4 and FIG. 5 of the second embodiment are compared, the beam occupancy is increased in FIG. 5 as compared to FIG. 4.

Therefore, in the second embodiment, when the arrangement with the hexagonal lattice shape cannot be adopted as the array of the light emitting elements 11 due to various restrictions such as the performance of a device used when the light emitting elements 11 are arrayed, the electrode structure of the light source 1 or the required number of light emitting elements 11, the beam occupancy can be increased to some extent to increase the light condensing property of the multiplexed beam.

Third Embodiment

<Array with Arc Shape>

Figure 6:
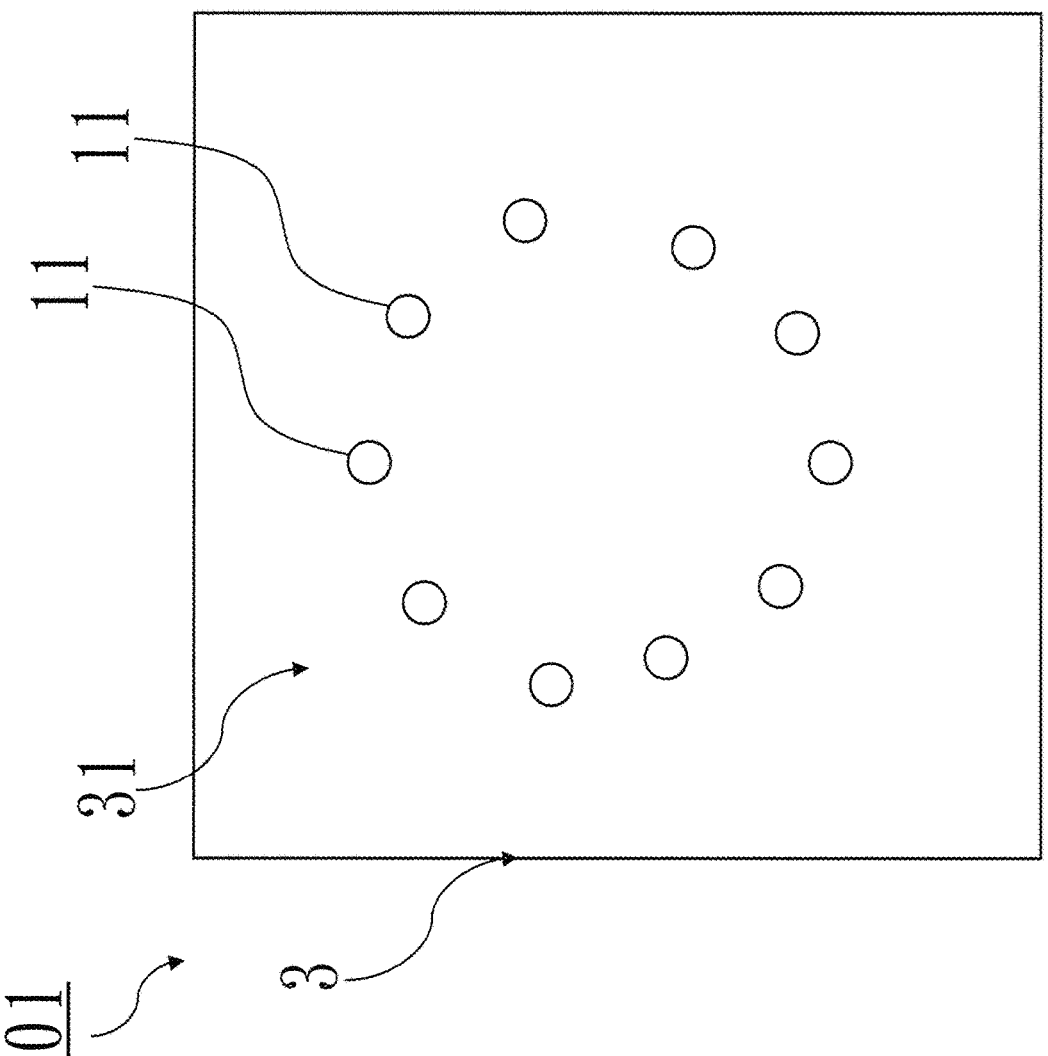
FIG. 6 illustrates a light source in a third embodiment as viewed from the direction of the optical axis A of the multiplexing optical system.
Figure 7:
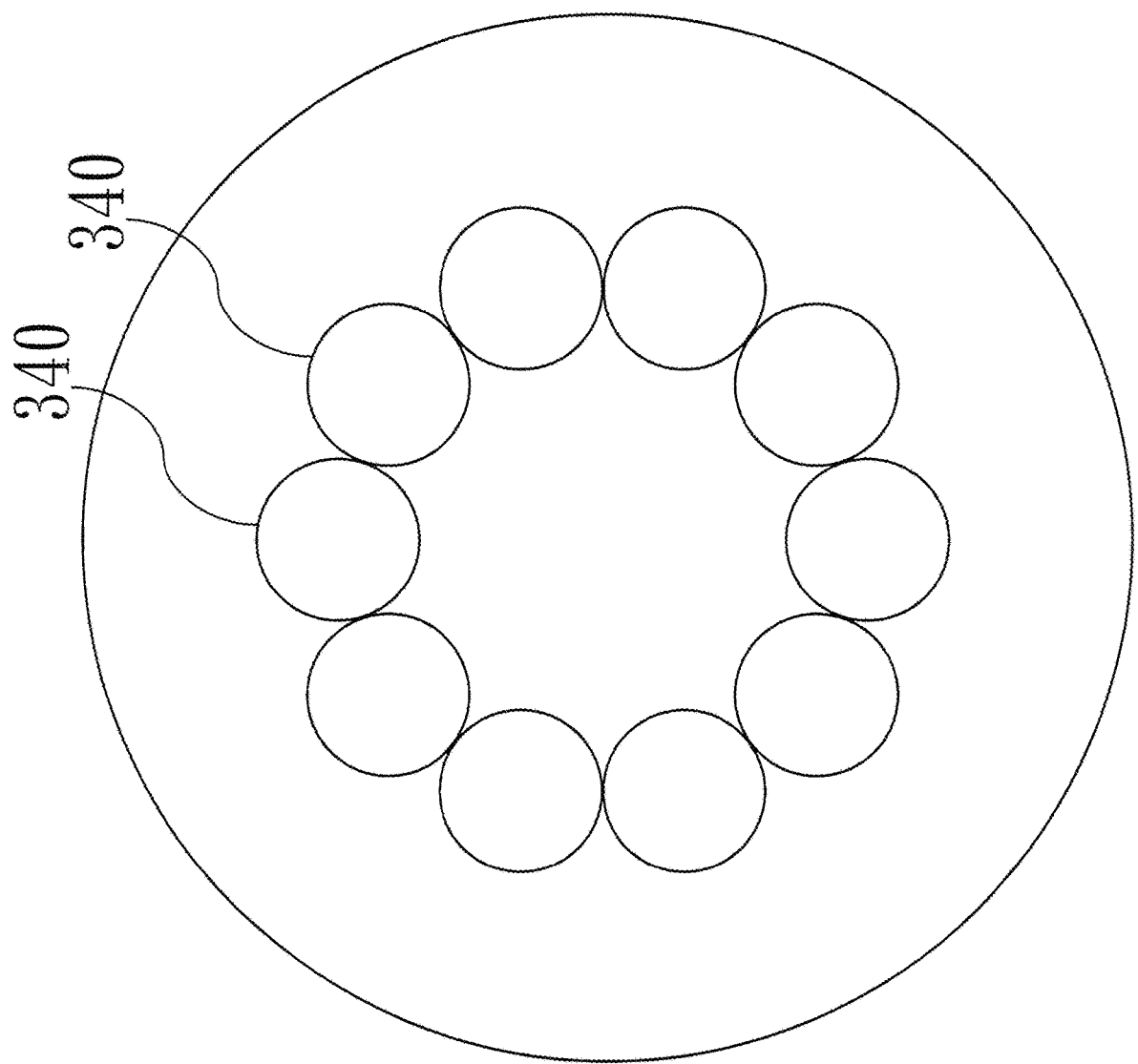
FIG. 7 illustrates a lens array in the third embodiment as viewed from the direction of the optical axis A of the multiplexing optical system.

FIG. 6 illustrates an array of light emitting elements 11 included in a light source 301 in a multiplexing optical system according to a third embodiment of the present invention. Further, FIG. 7 illustrates an array of lens regions 340 in a lens array 304 in the third embodiment.

In the third embodiment, the light source 301 includes 10 light emitting elements 11. The 10 light emitting elements 11 are arrayed in a circumference at equal angles on the surface 31 of the heat sink 3. For example, the surface 31 is a single surface.

The beam occupancy obtained by the array with the circumference at equal angles in the third embodiment is lower than the beam occupancy obtained by the array with the hexagonal lattice shape in the first embodiment. However, when FIG. 6 and FIG. 7 of the third embodiment are compared, the beam occupancy is increased in FIG. 7 as compared to FIG. 6.

Therefore, in the third embodiment, when the arrangement with the hexagonal lattice shape cannot be adopted as the array of the light emitting elements 11 due to various restrictions such as the performance of a device used when the light emitting elements 11 are arrayed, the electrode structure of the light source 1 or the required number of light emitting elements 11, the beam occupancy can be increased to some extent to increase the light condensing property of the multiplexed beam.

Fourth Embodiment

<Polyhedral Prism>

Figure 8:
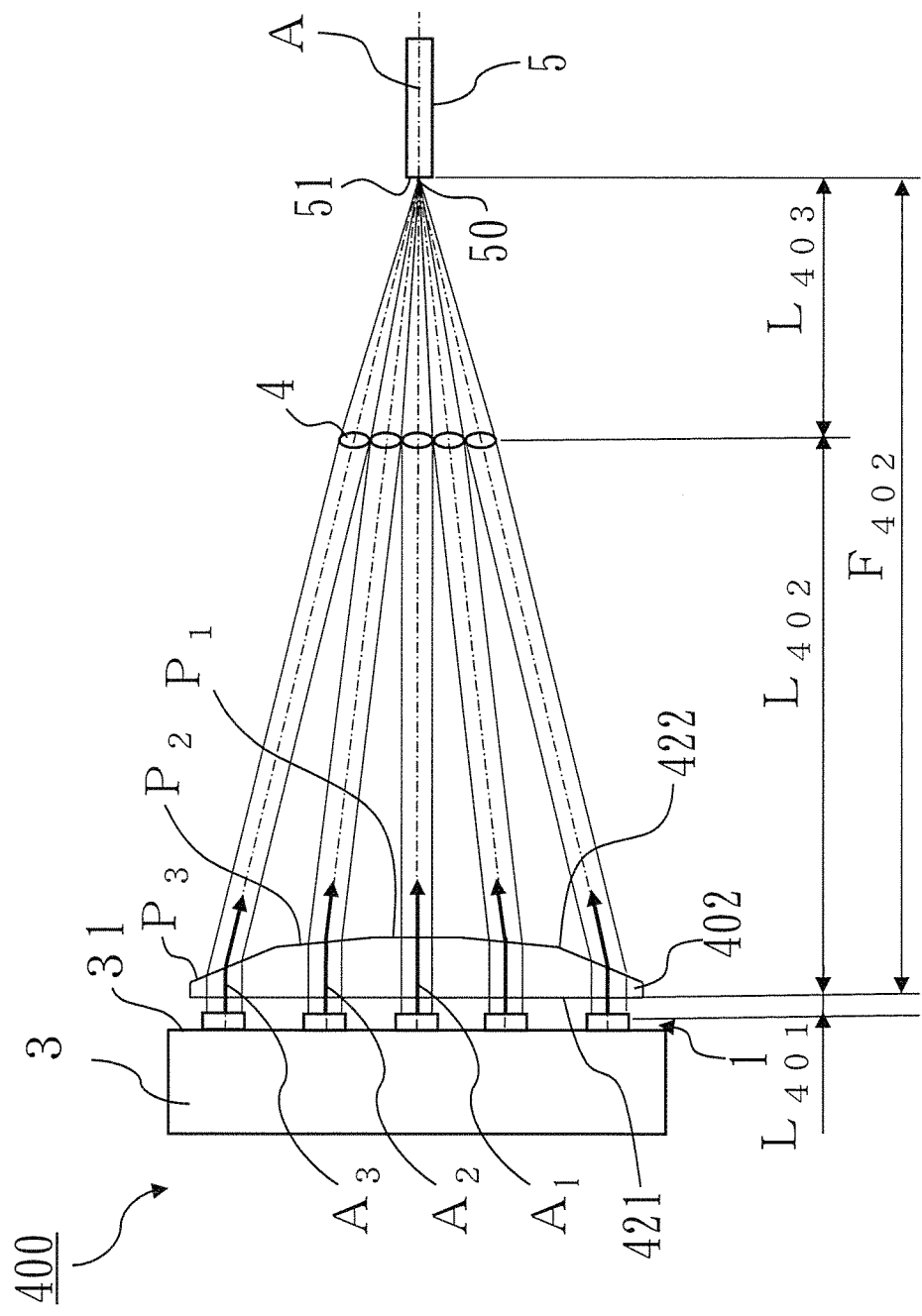
FIG. 8 illustrates a configuration of a multiplexing optical system according to a fourth embodiment.

FIG. 8 illustrates a cross section taken along a plane including the optical axis A in a multiplexing optical system 400 according to a fourth embodiment of the present invention.

The multiplexing optical system 400 includes the light source 1, a polyhedral prism 402 and the lens array 4. The multiplexing optical system 400 may include the optical fiber 5.

In the fourth embodiment, the polyhedral prism 402 is used in place of the lens 2 in the first embodiment. Other components of the multiplexing optical system 400 are identical or similar to those of the multiplexing optical system 100. Therefore, the identical components or components similar to those of the multiplexing optical system 100 are denoted by same reference symbols, and description thereof is omitted.

A distance from each light emitting element 11 of the light source 1 to the polyhedral prism 402 is represented by $L_{401}$. Further, a distance from the polyhedral prism 402 to the lens array 4 is represented by $L_{402}$. Moreover, a distance from the lens array 4 to the incident surface 51 of the optical fiber 5 is represented by $L_{403}$.

The polyhedral prism 402 is arranged between the light source 1 and the lens array 4. The polyhedral prism 402 has prism surfaces $P_n$ corresponding to the respective light emitting elements 11. The suffix n is n=1, 2, 3, ..., N. N is the number of light emitting elements 11. Further, the suffix n also corresponds to the suffix n of the center light beam $A_n$. That is, the suffix n of the prism surfaces $P_n$ is identical with the suffix n of the center light beam $A_n$.

The polyhedral prism 402 has an incident surface 421 and an exit surface 422. The incident surface 421 of the polyhedral prism 402 is a flat surface perpendicular to the optical axis A of the multiplexing optical system 400. The exit surface 422 of the polyhedral prism 402 includes the prism surfaces $P_n$. The prism surfaces $P_n$ are surfaces corresponding to the respective N light emitting elements 11, and they are directed differently from each other.

In this case, the inclinations of the prism surfaces $P_1$ to $P_N$ with respect to the optical axis A are determined so that the center light beams $A_n$ of the laser light beams emitted from the light emitting elements 11 intersect with each other on the optical axis A at a focal length $F_{402}$ from the polyhedral prism 402. The position on the optical axis A at the focal length $F_{402}$ from the polyhedral prism 402 corresponds to a light condensing position. In the fourth embodiment, the light condensing position corresponds to the center 50 of the incident surface 51 of the optical fiber 5.

The laser light beams emitted from the light emitting elements 11 perpendicularly enter the incident surface 421 of the polyhedral prism 402. The laser light beams that have entered the polyhedral prism 402 exit from the corresponding prism surfaces $P_n$.

The laser light beams exiting from the polyhedral prism 402 travel toward the above-mentioned light condensing position. If the lens array 4 is absent, the center light beams $A_n$ of the laser light beams exiting from the polyhedral prism 402 are condensed at the center 50 of the incident surface 51 of the optical fiber 5.

In the laser light beams exiting from the polyhedral prism 402, the adjacent laser light beams approach each other as they travel. Then, at the position apart from the polyhedral prism 402 by the distance $L_{402}$, the outermost diameters of the adjacent laser light beams are in contact with each other.

The lens array 4 is arranged at the position apart from the polyhedral prism 402 by the distance $L_{402}$. In other words, the lens array 4 is arranged at a position where the outermost diameters of the adjacent laser light beams exiting from the polyhedral prism 402 are in contact with each other. Then, the laser light beams enter the corresponding lens regions 40 of the lens array 4.

Each laser light beam passes through the lens array 4 so that its energy loss is suppressed at the minimum. The laser light beams that have passed through the lens array 4 are condensed at the center 50 of the incident surface 51 of the optical fiber 5 to become the multiplexed beam. Their energy are concentrated at the center 50 of the incident surface 51 of the optical fiber 5.

In the fourth embodiment, the conditions of the multiplexing optical system 400 are set such that the sum of the distance $L_{402}$ and $L_{403}$ is equal to the focal length $F_{402}$. The conditions of the multiplexing optical system 400 are such as the focal length $F_{402}$, the focal length $F_{404}$ of the lens array 4, the distance $L_{401}$, the distance $L_{402}$ and the distance $L_{403}$.

The conditions of the multiplexing optical system 400 are set depending on the characteristics of the light source 1 and desired characteristics of the multiplexed beam. As described above, similarly to the first embodiment, a multiplexed beam with a high light condensing property can be obtained.

The incident surface 421 of the polyhedral prism 402 is not limited to be a flat surface. For example, the incident surface may be a polyhedron.

Further, the optical path changing member in the present invention is the lens 2 in the first to third embodiments, and is the polyhedral prism 402 in the fourth embodiment. However, the optical path changing member is not limited to those two members. For example, a diffractive optical element can be used as the optical path changing member.

By using the diffractive optical element, the thickness of the optical path changing member can be reduced.

In the above-mentioned embodiments, a term indicating a positional relationship between members, such as "parallel" or "perpendicular," or a term indicating a shape of a member is used in some cases, but it is intended that those terms encompass ranges considering manufacturing tolerances, assembly variations, and the like. Therefore, when there is description indicating a positional relationship between members or a shape of a member in the claims, it is intended that the claims encompass the ranges considering the manufacturing tolerances, the assembly variations, and the like.

<Method of Designing Shape of Lens Array>

Finally, a method of designing the shape of the lens array in the above-mentioned first embodiment is described supplementarily. In the first embodiment, in order to increase the light condensing property of the multiplexed beam, it is required that the shape of the lens array 4 and the shapes of the lens surfaces of the lens regions 40 included in the lens array 4 are appropriately designed. The designing method described below can be similarly applied also to the second to fourth embodiments.

Figure 9:
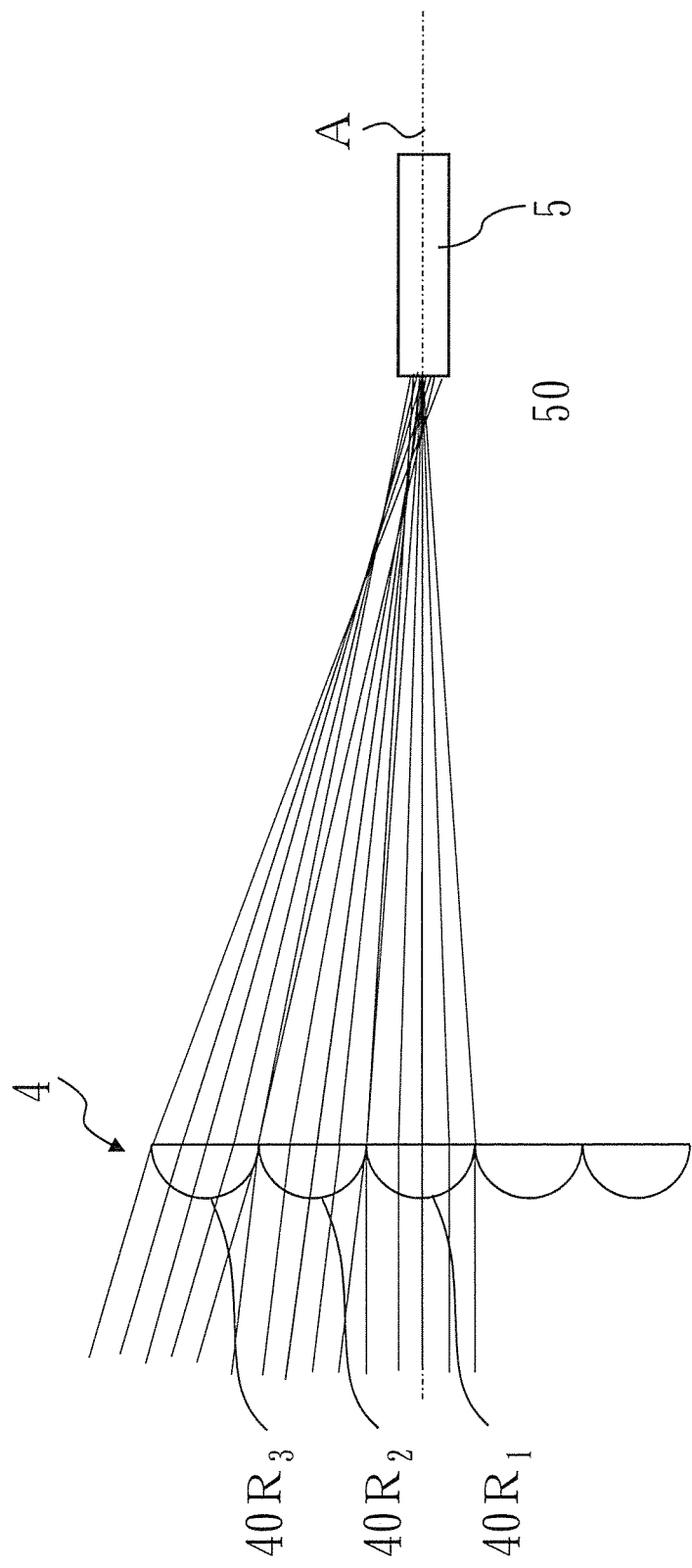
FIG. 9 illustrates how laser light beams that have passed through the lens array are condensed in a case in which the lens array in the first embodiment has an inappropriate shape.

FIG. 9 illustrates how the laser light beams that have passed through the lens array 4 are condensed in a case when the lens array 4 in the first embodiment has an inappropriate shape. In FIG. 9, in the lens regions 40 included in the lens array 4, the lens region $40R_1$ arranged on the optical axis A and the lens regions $40R_2$ and $40R_3$ arranged off the optical axis A all have the same shape and are on the same plane.

In FIG. 9, the laser light beam that have passed through the lens region $40R_1$ arranged on the optical axis A forms a smallest spot at the incident surface 51 of the optical fiber 5. In contrast, the laser light beams that have passed through the lens regions $40R_2$ and $40R_3$ arranged off the optical axis A form smallest spots before arriving at the incident surface 51. Further, the laser light beams do not intersect at one point but intersect in a shifted manner.

When the laser light beam enters the lens region 40 obliquely with respect to the optical axis of the lens region 40, aberrations such as field curvature, astigmatism or coma are liable to occur. In the multiplexing optical system having aberrations, the light condensing spot is disadvantageously increased. As a result, the beam diameter at the incident surface 51 of the optical fiber 5 is increased, and thus the light condensing property of the multiplexed beam is decreased.

As a method of correcting those aberrations, there are known methods of combining a plurality of lenses or forming a lens surface into an aspherical surface. However, in a configuration using a lens array, the method of using a plurality of lenses to correct the aberrations is not suitable for the following reasons. The lens array is an expensive optical member, and relative positions of the plurality of lens arrays are required to be adjusted at high accuracy. Meanwhile, of the above-mentioned aberrations, field curvature is known to be an aberration that cannot be corrected by one lens.

In this case, it is considered to use one lens array to match the light condensing positions of the laser light beams that have passed through the lens regions and thereby obtain a multiplexed beam with a high light condensing property. The shape of the lens array herein refers to the shapes of both surfaces and the thickness of each of the lens regions, and also the relative positions of the lens regions in the lens array. Further, in order that all the lens regions have equal magnifications, the lens regions are required to have equal focal lengths.

Suitable Shape of Lens Array: First Example

Figure 10:
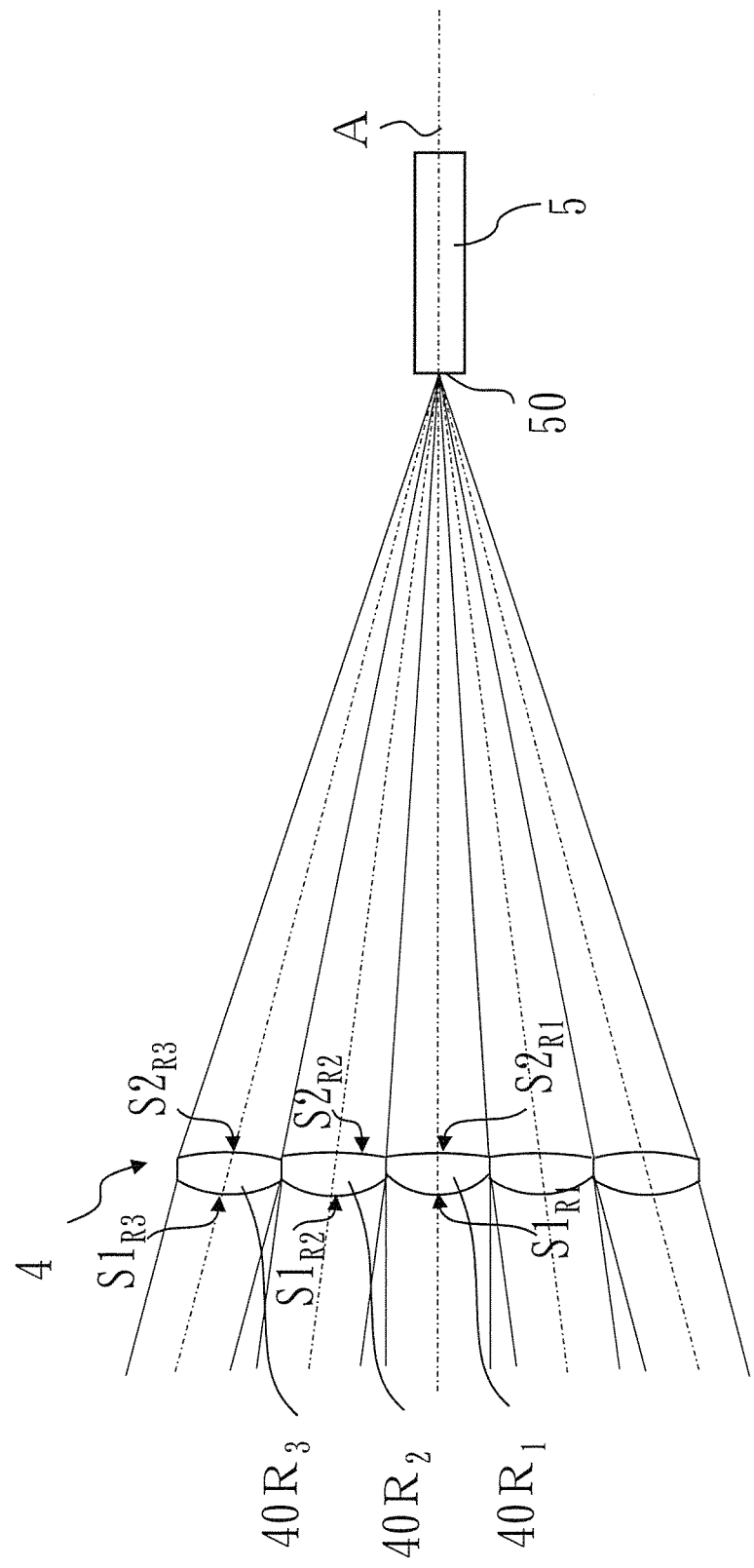
FIG. 10 illustrates a first example of a suitable shape of the lens array in the first embodiment.

FIG. 10 illustrates a first example of a suitable shape of the lens array 4 in the first embodiment.

In FIG. 10, the optical axes of lens regions 40 of the lens array 4 are parallel to the optical axis A of the multiplexing optical system 100.

In each lens region 40, at least one lens surface (In this case, a lens surface on the light source side) is an aspherical surface and corrects aberrations other than field curvature. In particular, the lens regions $40R_2$ and $40R_3$ arranged off the optical axis A suppress astigmatism and coma. When both surfaces of each lens region 40 are formed into aspherical surfaces, the aberrations can be corrected more satisfactorily.

In FIG. 10, lens surfaces on the light source side of the lens regions $40R_1$, $40R_2$ and $40R_3$ are represented by $S1_{R1}$, $S1_{R2}$ and $S1_{R3}$, respectively. Further, lens surfaces on the light condensing point side of the lens regions $40R_1$, $40R_2$ and $40R_3$ are represented by $S2_{R1}$, $S2_{R2}$ and $S2_{R3}$, respectively.

Further, the curvatures of the lens surfaces $S1_{R1}$, $S1_{R2}$ and $S1_{R3}$ on the light source side are represented by $C_{1R1}$, $C_{1R2}$ and $C_{1R3}$, respectively. Further, the curvatures of the lens surfaces $S2_{R1}$, $S2_{R2}$ and $S2_{R3}$ on the light condensing point side are represented by $C_{2R1}$, $C_{2R2}$ and $C_{2R3}$, respectively.

At this time, the curvatures $C_{2R1}$, $C_{2R2}$ and $C_{2R3}$ are designed so as to satisfy the following relational expression.

$$C_{2R1} < C_{2R2} < C_{2R3} \quad (1)$$

In general, for each lens region 40, the curvature of the lens surface on the light condensing point side is designed to be increased as the distance between the optical axis of the lens region and the optical axis A of the multiplexing optical system 100 is increased.

In a case of a constant focal length, when the curvature of the lens surface on the light condensing point side is increased, a long back focus can be taken. When the lens array 4 is designed as described above, the distance from the lens surface on the light condensing point side to the light condensing position is increased as the lens region 40 is separated from the optical axis A of the multiplexing optical system 100. That is, as the lens region 40 is separated from the optical axis A of the multiplexing optical system 100, the curvature of the lens surface on the light condensing point side is increased so that the extension of the back focus and the forward tilt at the light condensing position caused by the field curvature can cancel each other out. As a result, the laser light beams that have passed through the lens regions 40 form smallest spots at the same position.

In the above-mentioned case, the front focus is reduced. However, in the first embodiment, the distance $L_2$ is several to several ten times the distance $L_3$. Therefore, such a minute distance change of the front focus caused by the field curvature causes only a small effect.

When the shape of the lens array 4 is designed as described above, the aberrations can be corrected to obtain satisfactory light condensing spots, and the positions where the smallest spots are formed can be aligned. Thus, the light condensing property of the multiplexed beam can be increased.

Suitable Shape of Lens Array: Second Example

Figure 11:
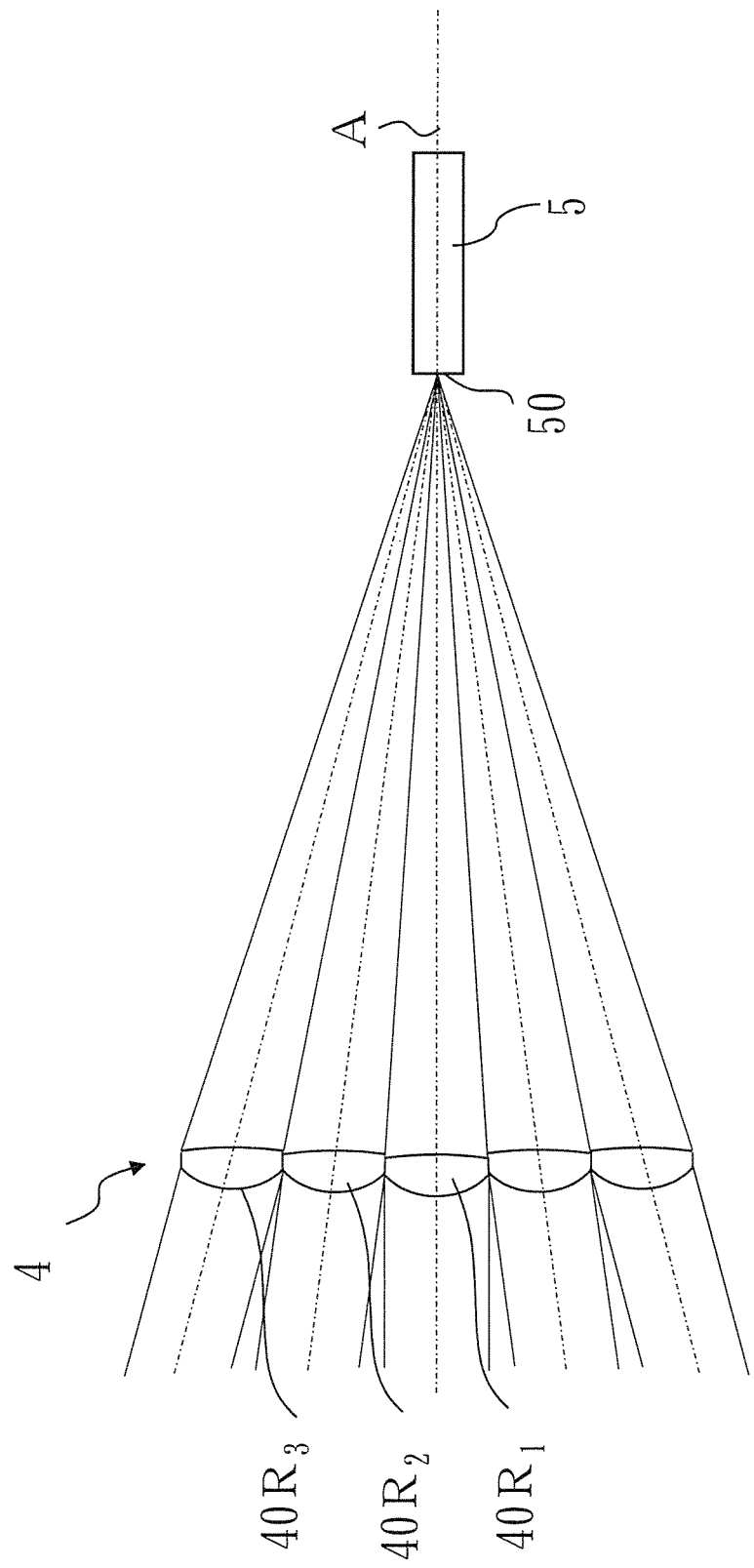
FIG. 11 illustrates a second example of a suitable shape of the lens array in the first embodiment.

FIG. 11 illustrates a second example of a suitable shape of the lens array 4 in the first embodiment.

In FIG. 11, the optical axes of the lens regions 40 of the lens array 4 are parallel to the optical axis A of the multiplexing optical system 100. Further, the lens regions 40 have the identical shape. That is, in the lens regions 40, all of the lens surfaces on the light source side have the identical shape, and all of the lens surfaces on the light condensing point side also have the identical shape.

In each lens region 40, at least one lens surface (In this case, the lens surface on the light source side) is an aspherical surface and corrects aberrations other than field curvature.

Further, for each of the lens regions $40R_1$, $40R_2$ and $40R_3$, the lens region is more protruded to the light condensing point side as said lens region is positioned closer to the peripheral edge of the lens array 4. That is, the lens region is protruded to the light condensing point side in the order of the lens regions $40R_1$, $40R_2$ and $40R_3$. That is, as the optical axis of the lens region is farther from the optical axis A of the multiplexing optical system 100, the lens region is arranged at a position more shifted to the light condensing point side along the optical axis A of the multiplexing optical system 100.

In other words, for each lens region 40, as the distance between the optical axis of said lens region 40 and the optical axis A of the multiplexing optical system 100 is increased, the surface vertex of the lens surface on the light condensing point side of said lens region 40 is positioned closer to the light condensing point side along the optical axis A of the multiplexing optical system 100. In this manner, the forward tilt of an image plane caused by the field curvature is corrected.

When the lens region 40 is more protruded to the light condensing point side as said lens region 40 is closer to the peripheral edge, the distance between the lens region 40 and the lens 2 is slightly reduced. However, similarly to the case of the above-mentioned first example, this configuration causes only a small effect.

When the shape of the lens array 4 is designed as described above, the aberrations can be corrected to obtain satisfactory light condensing spots, and the positions at which the smallest spots are formed can be aligned. Thus, the light condensing property of the multiplexed beam can be increased.

REFERENCE SIGNS LIST 100, 400 multiplexing optical system, 1, 201, 301 light source, 11 light emitting element, 2 lens (optical path changing member), 402 polyhedral prism (optical path changing member), 4, 204, 304 lens array (light condensing member), 40, 240, 340 lens region, 5 optical fiber, 51 incident surface

The invention claimed is:
1. A multiplexing optical system, comprising:
a light source including a plurality of light emitting elements of surface emitting lasers;
an optical path changing member configured to change and concentrate optical paths of laser light beams emitted from the light emitting elements; and
a light condensing member which includes a plurality of lens regions arrayed so as to correspond to respective optical paths of the laser light beams changed by the optical path changing member, and is configured to condense the laser light beams by the lens regions to form a multiplexed beam,
wherein the plurality of light emitting elements of the light source and the plurality of lens regions have a one-to-one correspondence.

2. The multiplexing optical system according to claim 1, wherein optical axes of the light emitting elements are parallel to each other.

3. The multiplexing optical system according to claim 1, wherein the light emitting elements are arrayed on a single surface.

4. The multiplexing optical system according to claim 1, wherein the light condensing member condenses the laser light beams at a predetermined point by the lens regions.

5. The multiplexing optical system according to claim 1, wherein the light condensing member is arranged at a position where outermost diameters of adjacent laser light beams exiting from the optical path changing member are in contact with each other.

6. The multiplexing optical system according to claim 1, wherein a size of each of the lens regions included in the light condensing member is determined such that the size is equal to an outermost diameter of each of the laser light beams entering the lens regions, and
wherein the laser light beams exit from the light condensing member so that the outermost diameters of the adjacent laser light beams are in contact with each other.

7. The multiplexing optical system according to claim 6, wherein the optical path changing member is a lens arranged between the light source and the light condensing member.

8. The multiplexing optical system according to claim 6, wherein the optical path changing member is a polyhedral prism arranged between the light source and the light condensing member.

9. The multiplexing optical system according to claim 6, wherein the optical path changing member is a diffractive optical element arranged between the light source and the light condensing member.

10. The multiplexing optical system according to claim 6, wherein the light condensing member is a lens array including the lens regions.

11. The multiplexing optical system according to claim 10, wherein, in the lens regions, an optical axis of each lens region is parallel to an optical axis of the multiplexing optical system.

12. The multiplexing optical system according to claim 10, wherein, for each of the lens regions, at least one lens surface of the lens region is an aspherical surface.

13. The multiplexing optical system according to claim 10, wherein, for each of the lens regions, a curvature of a lens surface on a light condensing point side of the lens region varies depending on a distance between an optical axis of the lens region and an optical axis of the multiplexing optical system.

14. The multiplexing optical system according to claim 13, wherein, for each of the lens regions, the curvature of the lens surface on the light condensing point side of the lens region is increased as the distance between the optical axis of the lens region and the optical axis of the multiplexing optical system is increased.

15. The multiplexing optical system according to claim 10, wherein, for each of the lens regions, a surface vertex of a lens surface on a light condensing point side of the lens region varies in position in a direction along an optical axis of the multiplexing optical system depending on a distance between an optical axis of the lens region and the optical axis of the multiplexing optical system.

16. The multiplexing optical system according to claim 15, wherein, for each of the lens regions, the surface vertex of the lens surface on the light condensing point side of the lens region is positioned closer to the light condensing point side along the optical axis of the multiplexing optical system as the distance between the optical axis of the lens region and the optical axis of the multiplexing optical system is increased.

17. The multiplexing optical system according to claim 6, wherein the light emitting elements are arrayed into a hexagonal lattice shape.

18. The multiplexing optical system according to claim 6, Wherein the multiplexing optical system further comprises an optical fiber configured to transmit therein the multiplexed beam which is formed by the light condensing member and enters the optical fiber from an incident surface thereof,
wherein the optical fiber is a large mode area fiber.

19. The multiplexing optical system according to claim 1, wherein the surface emitting lasers are two-dimensional photonic crystal surface emitting lasers.

* * * * *